March 27, 1951

A. H. A. WYNN 2,546,248

ELECTRICAL TEST APPARATUS

Filed July 1, 1944

Inventor
ARTHUR HENRY ASHFORD WYNN

By Ralph B. Stewart
Attorney

Patented Mar. 27, 1951

2,546,248

UNITED STATES PATENT OFFICE 2,546,248

ELECTRICAL TEST APPARATUS

Arthur Henry Ashford Wynn, London, England, assignor to A. C. Cossor Limited, London, England, a British company Application July 1, 1944, Serial No. 543,099
In Great Britain July 14, 1943

3 Claims. (Cl. 250—20)

Figures 1, 2, 3:
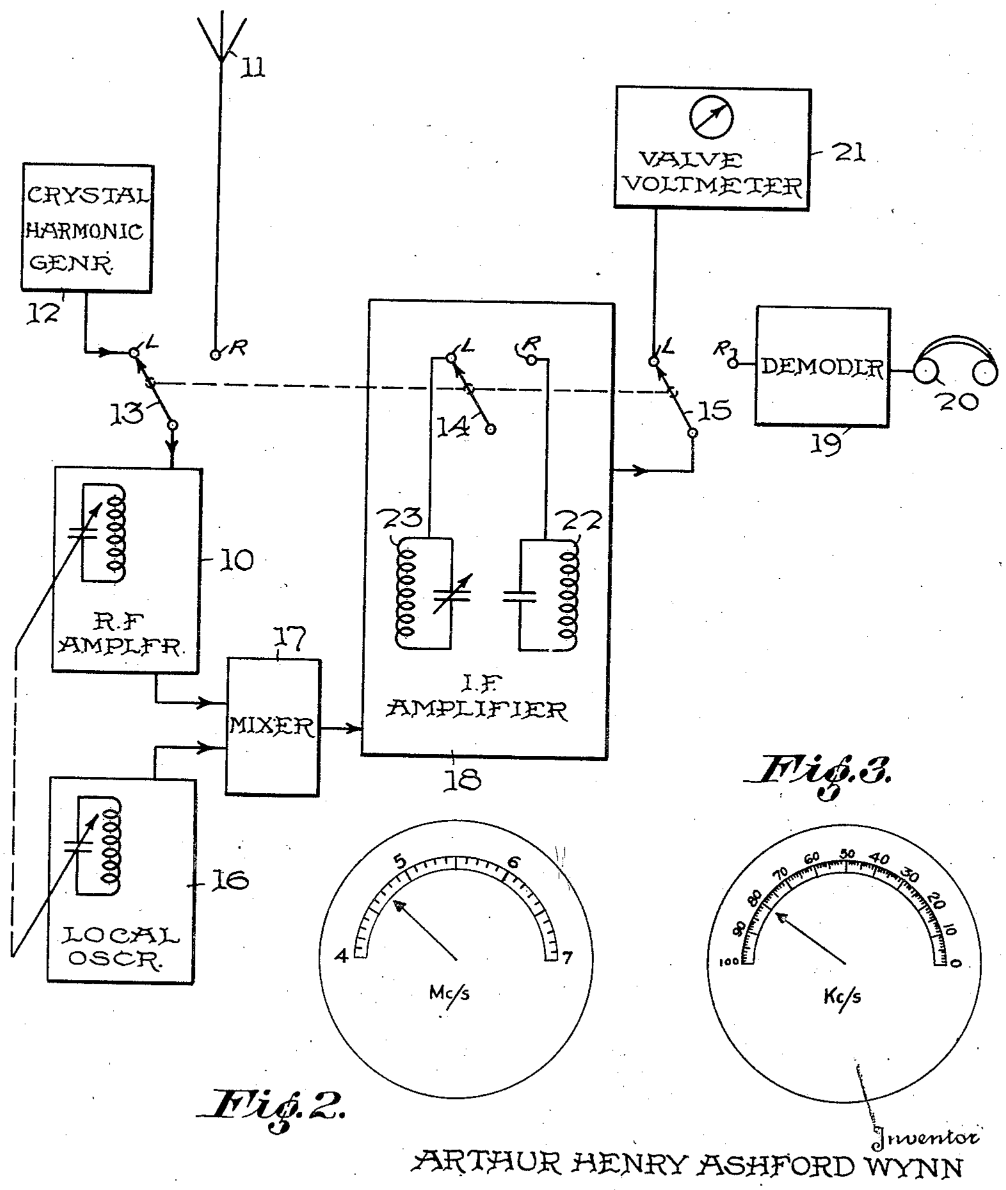

This invention relates to means for rapid and accurate setting of the tuning of an electrical oscillator to any desired frequency within its operating range, or for rapid and accurate checking of the operating frequency of such an oscillator at any given setting of its tuning mechanism.

In the arrangement according to the invention, a stable oscillation generator is employed which produces output voltage components at all frequencies within the range of operating frequencies of the oscillator which are multiples of a relatively low unit frequency. For this purpose a crystal harmonic generator may be employed.

For any given setting of the tuning mechanism of the oscillator, a component of nearby frequency is selected from the output of the stable generator, and the frequencies of this output component and of the oscillator are compared. The comparison is preferably effected by the development of a difference beat frequency oscillation and by checking this beat frequency by means of a sharply tuned variable frequency filter and means to indicate relative amplitudes of the output from this filter.

The invention is particularly applicable to the construction of a wavemeter which is integral with a superheterodyne radio receiver, and which is provided for rapid tuning of the receiver to any desired operating frequency within its range.

The accompanying drawing shows in Figure 1 a schematic circuit diagram of a superheterodyne radio with which is combined a wavemeter for checking the radio signal reception frequency to which it is tuned.

Figure 2 shows the tuning indicator scale for the radio frequency, amplifier, and Figure 3 shows the tuning indicator scale for the tunable filter.

Radio frequency amplifier 10 receives its input alternatively from aerial 11 or from crystal harmonic generator 12, according to the attitude of switch 13, which is ganged with switches 14 and 15. When these ganged switches are thrown to the left, the equipment will operate as a wavemeter, but when these switches are thrown to the right, the equipment forms a conventional superheterodyne radio receiver with a pre-selection R. F. amplifier stage. It will be assumed that this is arranged to be tuned for reception at any radio frequency within the band 4 to 7 mc./s., and that the intermediate frequency employed is 400 kc./s.

The tuned circuits of R. F. amplifier 10 and local oscillator 16 are continuously tunable over the frequency range and are ganged so that the pass-band of R. F. amplifier 10, throughout the tuning range, is centred at a frequency about 400 kc./s. above the oscillation frequency of local oscillator 16.

The outputs of R. F. amplifier 10 and local oscillator 16 are mixed in mixer 17. The resultant is applied to the input of intermediate frequency amplifier 18. Switch 14 being thrown to the right, tuned circuits 22 fixedly tuned to the signal reception intermediate frequency of 400 kc./s. are brought into operation in I. F. amplifier 18.

Switch 15 being thrown to the right, demodulator 19 receives the output of I. F. amplifier 18. If frequency-modulated signals are to be received, this demodulator will include a limiter and a discriminator. A reproducing device shown as headphones 20 serves to reproduce the intelligence represented by the output of demodulator 19.

When switches 13, 14 and 15 are thrown to the left, the apparatus operates as a wavemeter.

Crystal harmonic generator 12 comprises a crystal which oscillates at 100 kc./s. This generator is designed to produce substantial output voltage components at all frequencies which are multiples of 100 kc./s. in the range of 4 to 7 mc./s. The frequencies of these components will be stable and accurate.

R. F. amplifier 10 serves as a filter to select components of desired frequencies from the output of generator 12. The tuning of this amplifier is sufficiently broad to pass at substantial amplitude, at any given setting, components within the band 400 to 500 kc./s. above the local oscillator frequency, but is sufficiently sharp to attenuate at least 20 dB a component 400 kc./s. below the local oscillator frequency.

I. F. amplifier 18, with switch 14 thrown to the left, has sharply resonant circuit 23 continuously tunable over a range of 100 kc./s., namely from 400 to 500 kc./s., substituted for the fixedly-tuned I. F. resonant circuits 22 which are used during radio signal reception.

A valve voltmeter 21 is brought into circuit by switch 15, when thrown to the left, to indicate relative strengths of the output of I. F. amplifier 18.

The tuning control for R. F. amplifier 10 and local oscillator 16 is calibrated in steps of 100 kc./s. only as shown in Figure 2. This calibration will correspond with the radio signal reception frequency, i. e. it will be 400 kc./s. above the local oscillator frequency throughout.

The tuning control for the tunable circuit 23 of I. F. amplifier 18 is calibrated in steps of 1 kc./s., reversely from 100 to 0 kc./s., over their actual tuning range from 400 to 500 kc./s. This is shown in Figure 3.

It will be seen that the actual tuning of the apparatus as a radio receiver is wholly determined by the setting of the tuning control of the R. F. amplifier 10 and local oscillator 16. Suppose, for example, that the radio signal reception frequency for which these are set is 5753 kc./s., the calibration of their tuning control will indicate merely that the setting is approximately mid-way between 5700 and 5800 kc./s. The actual frequency of local oscillator 16 will be 5753—400=5353 kc./s.

In order to read the last two digits of the tuning setting, switches 13, 14, 15 are thrown to the wavemeter attitude. The output of mixer 17 will contain components resulting from the beating of the local oscillator output with those crystal harmonics which pass R. F. amplifier 10. These will be at least the harmonics at 5700 and 5800 kc./s., and may include also at substantial strength those at 5600, 5900, 5500, 6000 etc. The component at 4900, however, which is more than 800 kc./s. away, will have been attenuated to negligible amplitude by R. F. amplifier 10.

From this output of the mixer, I. F. amplifier 18 can select only a beat frequency lying in the range 400 to 500 kc./s. The only such beat frequency is that resulting from the beat of the local oscillator with the crystal harmonic at 5800 kc./s., namely 447 kc./s. The image at 5353—4900=453 kc./s. does not appear owing to the attenuation of the crystal harmonic at 4900 kc./s. in R. F. amplifier 10.

When, therefore, the tuning of circuit 23 in I. F. amplifier 18 is varied over its complete range, a single setting is found at which a maximum output is observed by valve voltmeter 21. This setting corresponds to an I. F. tuning of 447 kc./s.; the corresponding calibration of the I. F. amplifier tuning control is 53 kc./s., giving the last two digits for the tuning setting. This setting is not disturbed when switches 13, 14, 15 are thrown to the right for radio reception.

I claim:

1. A system for determining the frequency of radio waves received on an antenna comprising, in combination, a super-heterodyne radio receiver including a radio frequency amplifier tunable over a predetermined frequency range, a tunable local oscillator ganged with said radio frequency amplifier, a mixer connected with said amplifier and said local oscillator for producing an intermediate frequency wave, an intermediate frequency amplifier connected to said mixer, and a demodulator connected with said intermediate frequency amplifier, an alternative source of waves for said radio frequency amplifier comprising a stable generator producing a plurality of waves having frequencies spaced at equal intervals within the tuning range of said amplifier, an alternative tuning circuit embodied in said intermediate frequency amplifier and being tunable over a range of frequencies equal to the interval between adjacent frequencies generated by said stable generator, and common switching means for simultaneously substituting said stable generator for said antenna and said alternative tuning circuit for said intermediate frequency circuit in said intermediate frequency amplifier.

2. In a radio receiving system, an antenna, a radio frequency amplifier tunable over a range of frequencies, a stable generator producing a plurality of waves having frequencies spaced at equal intervals within the tuning range of said amplifier, a switch for connecting the input of said amplifier alternatively to said antenna or to said stable generator, a local oscillator having tuning means ganged with the tuning of said amplifier, a mixer having its input connected with the output of said amplifier and with said local oscillator, an intermediate frequency amplifier connected to the output of said mixer and including a circuit tuned to the intermediate frequency produced by said mixer, a tuning circuit in said intermediate frequency amplifier tunable over a frequency range equal to the interval between adjacent frequencies generated by said stable generator, a second switch for rendering operative one or the other of said tuning circuits in said intermediate frequency amplifier, a demodulator, a wave indicator, and a third switch for connecting the output of said intermediate frequency amplifier alternatively to said demodulator or to said wave indicator, and common means for simultaneously operating said switches, said common means being arranged so that with said antenna connected to said radio frequency amplifier, the beat frequency tuned circuit is connected in said intermediate frequency amplifier, and the output of said intermediate frequency amplifier is connected to said demodulator.

3. The combination with a superheterodyne radio receiver comprising an antenna, a radio frequency circuit continuously tunable over a range of frequencies, a local oscillator continuously tunable over a range of frequencies so as always to differ from the frequency of the radio-frequency circuit by a fixed amount, a mixer circuit to which the outputs of said radio-frequency circuit and said local oscillator are both fed and from which are delivered beat waves of a fixed frequency, and an intermediate-frequency amplifier including a resonant circuit fixedly tuned to said beat waves, of apparatus for determining the receiver tuning frequency comprising a stable generator producing a plurality of waves having frequencies spaced at equal intervals within the tuning range of said radio frequency circuit, switching means for alternatively connecting said antenna or said stable generator to said radio frequency circuit, an alternative tuning circuit embodied in said intermediate frequency amplifier and being tunable over a range of frequencies equal to the interval between adjacent frequencies generated by said stable generator, and switching means for substituting said alternative tuning circuit for said fixedly tuned circuit in said intermediate frequency amplifier.

ARTHUR HENRY ASHFORD WYNN.

REFERENCES CITED

The following references are of record in the file of this patent:

UNITED STATES PATENTS

| Number | Name | Date |
|---|---|---|
| 1,611,224 | Nyquist | Dec. 21, 1926 |
| 1,874,295 | Hotopp | Aug. 30, 1932 |
| 1,966,230 | Andrew | July 10, 1934 |
| 2,075,962 | Roberts | Apr. 6, 1937 |
| 2,245,717 | Roberts | June 17, 1941 |
| 2,282,068 | Liebau et al. | May 5, 1942 |
| 2,393,856 | Collins | Jan. 29, 1946 |
| 2,409,845 | Gardiner et al. | Oct. 22, 1946 |

OTHER REFERENCES

QST for April 1939, pages 38 to 41 and 88. Article, "A Frequency-Checking Superhet," by D. A. Griffin.